US012587164B2

(12) United States Patent
Kimura et al.

(10) Patent No.: US 12,587,164 B2
(45) Date of Patent: Mar. 24, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Kentaro Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 227 days.

(21) Appl. No.: 18/224,091

(22) Filed: Jul. 20, 2023

(65) Prior Publication Data

US 2023/0370046 A1 Nov. 16, 2023

Related U.S. Application Data

(63) Continuation of application No. PCT/JP2022/012315, filed on Mar. 17, 2022.

(30) Foreign Application Priority Data

Mar. 24, 2021 (JP) ................................. 2021-049422

(51) Int. Cl.
| | |
|---|---|
| *H03H 9/13* | (2006.01) |
| *H03H 9/02* | (2006.01) |
| *H03H 9/145* | (2006.01) |
| *H03H 9/17* | (2006.01) |
| *H03H 9/25* | (2006.01) |

(52) U.S. Cl.
CPC .......... *H03H 9/13* (2013.01); *H03H 9/02039* (2013.01); *H03H 9/14541* (2013.01); *H03H 9/173* (2013.01); *H03H 9/25* (2013.01)

(58) Field of Classification Search
CPC .. H03H 9/13; H03H 9/02039; H03H 9/14541; H03H 9/173; H03H 9/25
See application file for complete search history.

(56) References Cited

U.S. PATENT DOCUMENTS

| | | | |
|---|---|---|---|
| 9,590,587 B1* | 3/2017 | Thalmayr .............. | H03H 9/059 |
| 2008/0296529 A1 | 12/2008 | Akiyama et al. | |
| 2012/0107557 A1 | 5/2012 | Akiyama et al. | |
| 2013/0127300 A1 | 5/2013 | Umeda et al. | |
| 2015/0084719 A1 | 3/2015 | Umeda | |
| 2017/0288122 A1* | 10/2017 | Zou ........................ | H03H 9/175 |

(Continued)

FOREIGN PATENT DOCUMENTS

| | | |
|---|---|---|
| JP | 2005065017 A | 3/2005 |
| JP | 2009010926 A | 1/2009 |

(Continued)

OTHER PUBLICATIONS

International Search Report in PCT/JP2022/012315, mailed May 31, 2022, 3 pages.

(Continued)

*Primary Examiner* — Samuel S Outten
(74) *Attorney, Agent, or Firm* — Keating & Bennett, LLP

(57) ABSTRACT

An acoustic wave device includes a scandium-containing aluminum nitride film and electrodes on at least one of first and second principal surfaces of the scandium-containing aluminum nitride film. The scandium-containing aluminum nitride film includes areas in which a crystal axis is deviated with respect to remaining portions of the scandium-containing aluminum nitride film.

14 Claims, 6 Drawing Sheets

(56) References Cited

U.S. PATENT DOCUMENTS

| | | | |
|---|---|---|---|
| 2019/0245510 A1 | 8/2019 | Mimura | |
| 2020/0083862 A1 | 3/2020 | Makkonen et al. | |
| 2020/0365794 A1* | 11/2020 | Thomas | H10N 30/082 |
| 2021/0399202 A1 | 12/2021 | Nagaoka et al. | |

FOREIGN PATENT DOCUMENTS

| | | | |
|---|---|---|---|
| JP | 2011015148 A | 1/2011 |
| JP | 2013128267 A | 6/2013 |
| JP | 2019140456 A | 8/2019 |
| JP | 2020057781 A | 4/2020 |

OTHER PUBLICATIONS

Written Opinion in PCT/JP2022/012315, mailed May 31, 2022, 4 pages.

* cited by examiner

ACOUSTIC WAVE DEVICE

CROSS REFERENCE TO RELATED APPLICATIONS

This application claims the benefit of priority to Japanese Patent Application No. 2021-049422 filed on Mar. 24, 2021 and is a Continuation Application of PCT Application No. PCT/JP2022/012315 filed on Mar. 17, 2022. The entire contents of each application are hereby incorporated herein by reference.

BACKGROUND OF THE INVENTION

1. Field of the Invention

The present invention relates to an acoustic wave device including a scandium-containing aluminum nitride film, which is a scandium-added aluminum nitride film.

2. Description of the Related Art

Conventionally, an acoustic wave device using a scandium (Sc)-containing aluminum nitride (AlN) film, that is, a ScAlN film, as a piezoelectric film, has been known. For example, in Japanese Unexamined Patent Application Publication No. 2009-010926, a BAW device using a scandium-added aluminum nitride film is disclosed. In the BAW device, excitation electrodes are provided on an upper surface and a lower surface of the ScAlN film. Also, a cavity portion is provided below the ScAlN film. Also in US2015/0084719 A1, a BAW device having a similar structure is disclosed.

SUMMARY OF THE INVENTION

In the conventional acoustic wave device using a Sc-added aluminum nitride film, when the concentration of Sc increases, piezoelectricity improves. However, when the Sc concentration increases, the ScAlN film may be warped or peeled off. Thus, there is a problem of a decrease in the non-defective ratio.

Preferred embodiments of the present invention provide acoustic wave devices each including a scandium-containing aluminum nitride film with less occurrence of warpage and peeling of the film.

An acoustic wave device according to a preferred embodiment of the present invention includes a scandium-containing aluminum nitride film and an electrode provided on at least one principal surface of the scandium-containing aluminum nitride film, in which the scandium-containing aluminum nitride film includes an area in which a crystal axis is deviated.

According to preferred embodiments of the present invention, it is possible to provide acoustic wave devices each including a scandium-containing aluminum nitride film with less occurrence of warpage and peeling of the film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the drawings, specific preferred embodiments of the present invention are described below, thereby clarifying the present invention.

Note that each preferred embodiment described in the specification is merely an example and partial replacement or combination of structures can be made between different preferred embodiments.

Figure 1A:
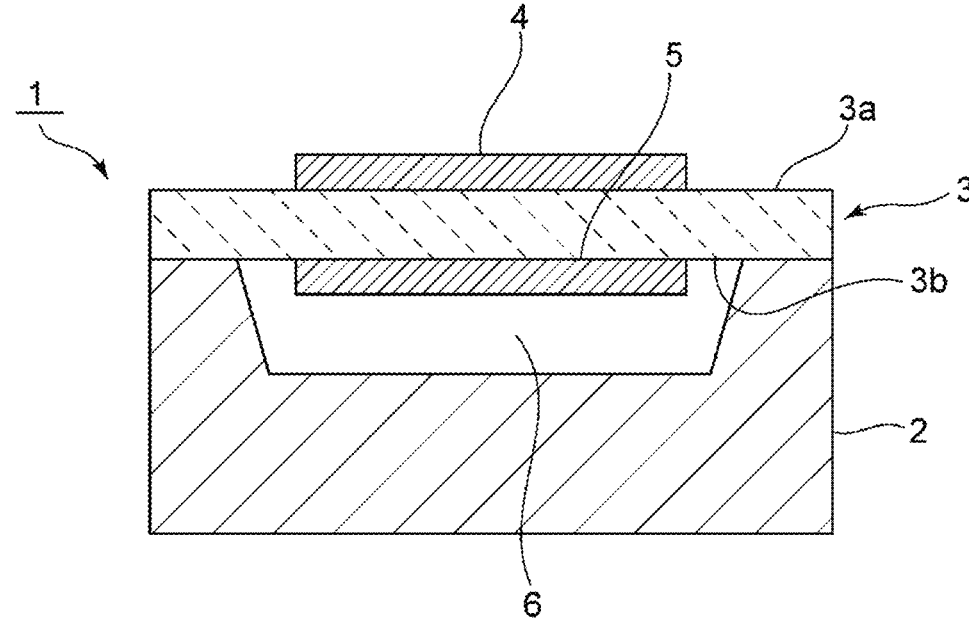
FIGS. 1A and 1B are a front sectional view and a plan view, respectively, of an acoustic wave device according to a first preferred embodiment of the present invention.
Figure 1B:
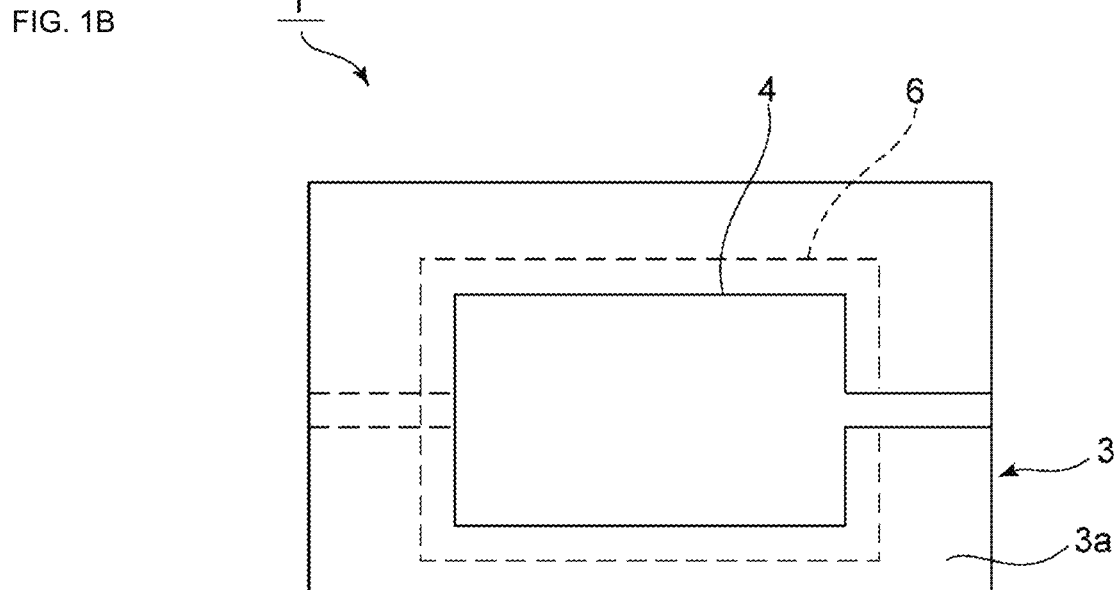

FIG. 1A is a front sectional view of an acoustic wave device according to a first preferred embodiment of the present invention, and FIG. 1B is its plan view.

An acoustic wave device 1 has a substrate 2 as a support substrate. On an upper surface of the substrate 2, a concave portion is provided. A scandium-containing aluminum nitride (ScAlN) film 3 is laminated so as to cover the concave portion of the upper surface of the substrate 2. The ScAlN film 3 includes a first principal surface 3a and a second principal surface 3b opposite to the first principal surface 3a. The second principal surface 3b is laminated on the upper surface of the substrate 2. With this, a cavity portion 6 is provided.

On the first principal surface 3a, a first excitation electrode 4 is provided. On the second principal surface 3b, a second excitation electrode 5 is provided. The first excitation electrode 4 and the second excitation electrode 5 overlap each other with the ScAlN film 3 interposed therebetween. This overlapping area is an excitation area. With an alternating-current electric field applied between the first excitation electrode 4 and the second excitation electrode 5, a bulk acoustic wave (BAW) as an acoustic wave is excited. The acoustic wave device 1 includes the ScAlN film 3 as a piezoelectric film, and is a BAW device in which an acoustic wave propagating through the ScAlN film 3 is mainly a BAW.

The cavity portion 6 is provided so as not to inhibit excitation of the BAW in the ScAlN film 3. Therefore, the cavity portion 6 is positioned below the excitation electrodes.

The substrate 2 is made of an appropriate insulating material or semiconductor. As this material, silicon, glass, GaAs, ceramics, quartz, or the like can be cited. In the present preferred embodiment, the substrate 2 is a high-resistance silicon substrate.

Note that the first excitation electrode 4 and the second excitation electrode 5 are made of an appropriate metal or alloy. As this material, a metal such as Ti, Mo, Ru, W, Al, Pt, Ir, Cu, Cr, or Sc or an alloy using any of these metals can be cited. Also, each of the first and second excitation electrodes 4 and 5 may be a multilayer body of a plurality of metal films.

The ScAlN film 3 can be formed with an appropriate method such as sputtering or CVD, for example. In the present preferred embodiment, the ScAlN film 3 is formed by using an RF magnetron sputter apparatus, for example.

On the occasion of sputtering described above, sputtering is performed by using a first target made of Al and a second target made of Sc in an atmosphere of nitrogen gas. That is, a ScAlN film is formed with binary sputtering. In this case, the degree of orientation of the ScAlN film can be controlled by adjusting sputtering conditions. As sputtering conditions, the magnitude of RF power, gas pressure, gas flow path, and the composition or purity of the material of a target can be cited.

Note that the orientation of the formed ScAlN film can be checked by using ASTAR (registered trademark). This ASTAR uses automated crystal orientation mapping-TEM method (ACOM-TEM method).

Figure 2:
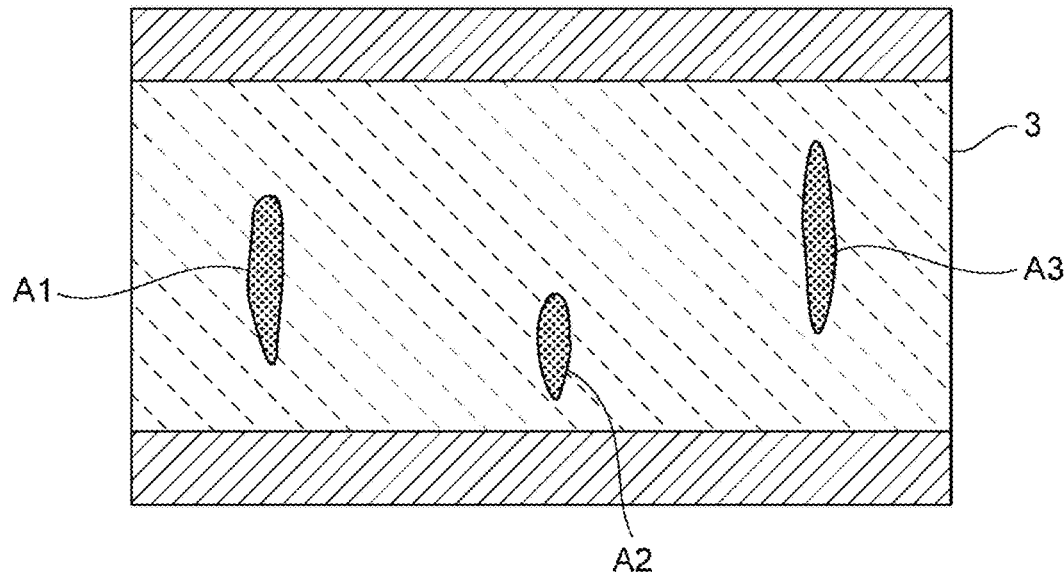
FIG. 2 is an enlarged front sectional view for describing a crystal portion in which the crystal axis in a scandium-containing aluminum nitride film in the acoustic wave device according to the first preferred embodiment of the present invention is deviated by an absolute value of about 3° or more.

FIG. 2 is a front sectional view depicting an orientation map of the ScAlN film 3 in the acoustic wave device 1 of the present preferred embodiment.

Three portions indicated by arrows schematically represent portions in which the crystal axis is deviated from the remaining portions by an absolute value of about 3° or more, for example. The acoustic wave device 1 has areas in which the crystal axis in the ScAlN film is significantly deviated from the remaining portions, for example, areas A1 to A3. Thus, while favorable piezoelectricity is maintained, warpage and peeling of the film can be reduced or prevented.

To acquire favorable piezoelectricity, it is desirable to enhance the orientation of the ScAlN film. Therefore, in the ScAlN film, it is desirable that portions in which a deviation of the crystal axis occurs are few. However, in the ScAlN film 3, since scandium is added to the aluminum nitride film, the crystal is distorted. In particular, if the amount of addition of scandium increases, film stress becomes too high, possibly causing warpage or peeling of the film.

As a result of studies on this point, the inventor has discovered that if a portion in which the crystal axis is deviated from the remaining portions is present as described above, the above-described film stress can, if anything, be reduced and warpage and peeling of the film can be reduced or prevented.

This is described based on a specific example of an experiment.

To form a scandium-containing aluminum nitride film by an RF magnetron sputter apparatus, the above-described sputtering conditions were controlled, and a ScAlN film of a sample 1 having a scandium concentration of about 6.8 atom % and a ScAlN film of a sample 2 having a scandium concentration of about 11.7 atom % were acquired. By using ASTAR described above, orientation maps of these scandium-containing aluminum nitride films were developed.

Here, the crystal axis is described. For example, when one with Si(100) is used as a support substrate, it is thought that ScAlN has a c-axis orientation with the normal direction being <0001> with respect to the Si(100) plane. Thus, the positions of the $2\theta/\omega$ axis, the $\Phi$axis, and the $\chi$ axis in which the strength of Si(100) is maximum were discovered and determined to correct a measured axis. On this corrected measured axis, the ScAlN film is scanned, and if the orientation of a portion in the ScAlN film is slightly deviated from the direction of the corrected measured axis, it is defined that "the crystal axis is deviated". Also, the amount of deviation from the direction of the measured axis after correction is assumed to be defined as a "deviation angle". By measuring this "deviation angle", the amount of deviation of the crystal axis can be defined.

Figure 3:
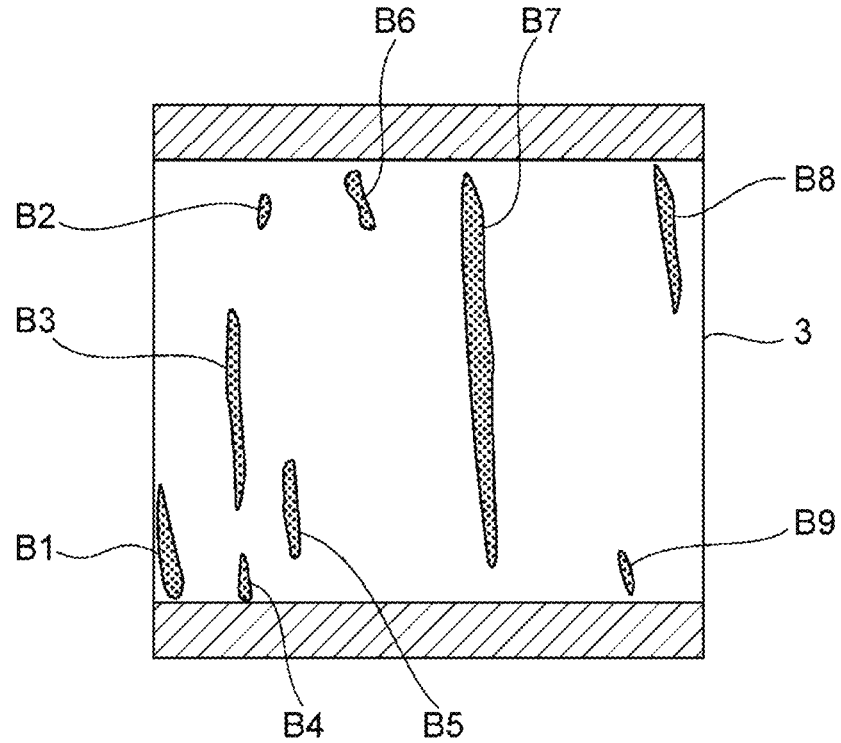
FIG. 3 is a schematic diagram depicting an orientation map of an aluminum nitride film having scandium with a scandium concentration of about 6.8 atom %.
Figure 4:
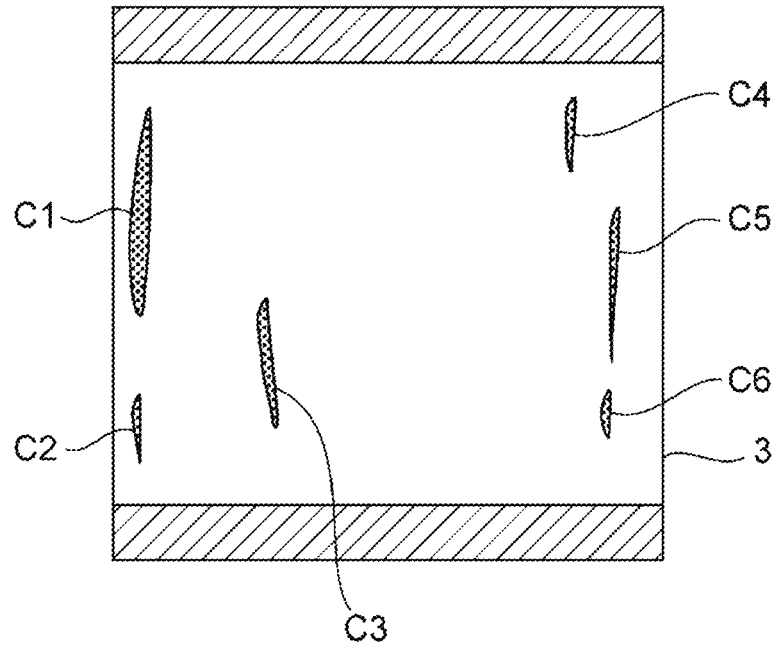
FIG. 4 is a schematic diagram depicting an orientation map of an aluminum nitride film having scandium with a scandium concentration of about 11.7 atom %.

FIG. 3 is a schematic diagram depicting an orientation map of a ScAlN film of the sample 1 with a scandium concentration of about 6.8 atom %, for example. FIG. 4 is a schematic diagram depicting an orientation map of a ScAlN film of the sample 2 with a scandium concentration of about 11.7 atom %, for example. In FIG. 3 and FIG. 4, areas in which the crystal axis is deviated by an absolute value of about 3° or more, for example, compared with the remaining portions are represented by applying multipoint hatching.

That is, in FIG. 3, areas B1 to B9 are areas in which the crystal axis is deviated by an absolute value of about 3° or more, for example, compared with the remaining portions. In FIG. 4, areas C1 to C6 are areas in which the crystal axis is deviated by an absolute value of about 3° or more, for example, compared with the remaining portions. From these orientation maps, ratios of areas in which the crystal axis is deviated with respect to the remaining portions by absolute values less than about 3°, more than or equal to about 3°, more than or equal to about 4°, and more than or equal to about 5°, for example, were determined. The results are depicted in FIG. 5.

Figure 5:
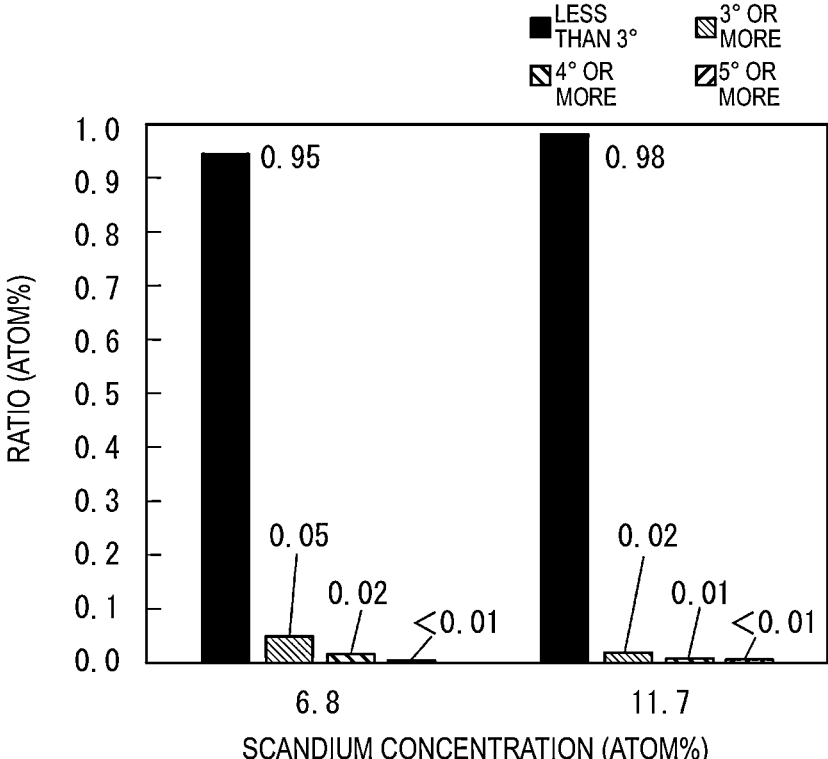
FIG. 5 is a diagram depicting scandium concentrations in the scandium-containing aluminum nitride film and ratios of portions with deviation of the crystal axis of being absolute values less than about 3°, more than or equal to about 3°, more than or equal to about 4°, and more than or equal to about 5°.

As evident from FIG. 5, in the sample 1 having a scandium concentration of about 6.8 atom %, the ratio of areas in which the crystal axis is deviated by an absolute value of about 3° or more compared with the remaining portions is about 5 atom %, for example. On the other hand, in the sample 2 having a scandium concentration of about 11.7 atom %, the areas in which the crystal axis is deviated by an absolute value of about 3° or more compared with the remaining portions was about 2 atom %, for example. In both of the sample 1 and the sample 2, since an area in which the crystal axis is deviated with respect to the remaining portions is present, it has been confirmed that when the film is formed on a substrate, the stress of the film is appropriately small and warpage and peeling can be reduced or prevented. Furthermore, since scandium is contained with a concentration as described above, favorable piezoelectricity can also be acquired.

Preferably, in the ScAlN film 3, areas in which the crystal axis is deviated by an absolute value of about 3° or more with respect to the remaining portions are mixed in areas of about 2% or more and about 5% or less of the entire ScAlN film 3, for example. In that case, distortion of the crystal can be more effectively mitigated, and warpage and peeling of the film can be further effectively reduced or prevented. Also, degradation in piezoelectricity due to these warpage and peeling of the film can be more effectively reduced or prevented.

Figure 6:
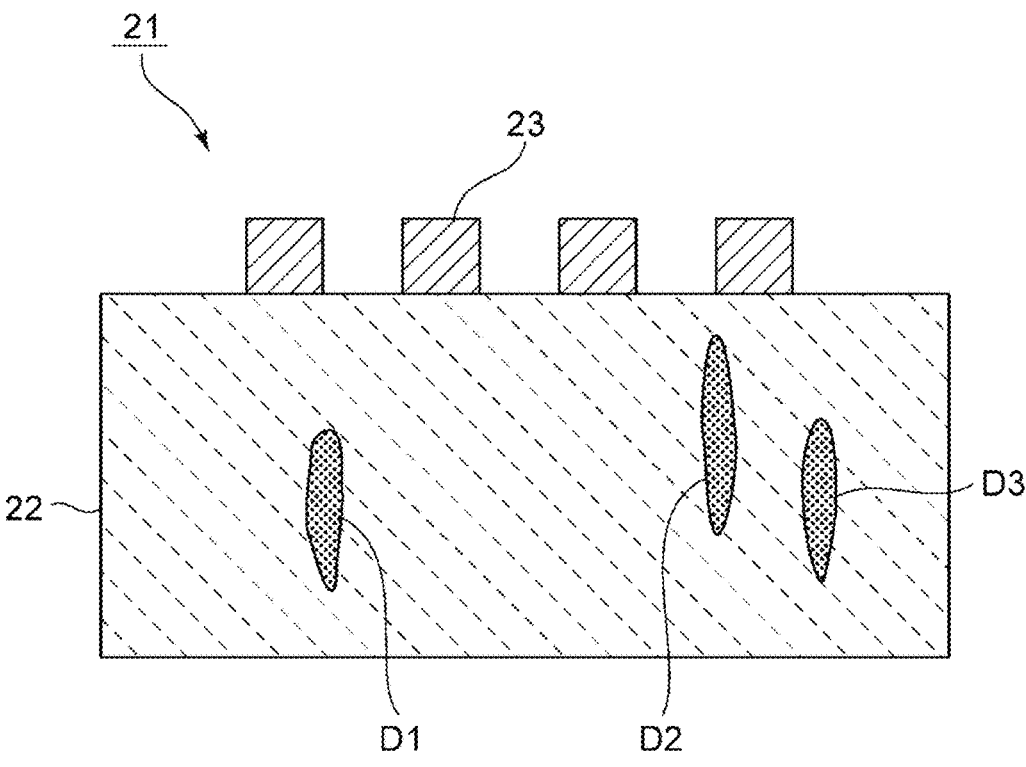
FIG. 6 is a front sectional view of an acoustic wave device of a second preferred embodiment of the present invention.

FIG. 6 is a front sectional view of an acoustic wave device according to a second preferred embodiment of the present invention. An acoustic wave device 21 of the second preferred embodiment includes a piezoelectric substrate 22 including a ScAlN film. On this piezoelectric substrate 22, an IDT electrode 23 is provided. The acoustic wave device 21 is a surface acoustic wave device (SAW device) provided with the IDT electrode 23. Also in the ScAlN film included in the piezoelectric substrate 22, areas D1 to D3 in which the crystal axis is different from the remaining areas by an absolute value of about 3° or more, for example, are mixed. Thus, as with the first preferred embodiment, distortion of the crystal is reduced or prevented, and warpage, peeling, and so forth of the film can be reduced or prevented. Also, favorable piezoelectricity can be acquired.

Note that the acoustic wave devices according to preferred embodiments of the present invention are not limited to a BAW device or SAW device and may be an acoustic wave device using a plate wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a scandium-containing aluminum nitride film; and
   an electrode provided on at least one principal surface of the scandium-containing aluminum nitride film; wherein
   the scandium-containing aluminum nitride film includes an area in which a crystal axis is deviated; and
   in the scandium-containing aluminum nitride film, areas in which the crystal axis is deviated by an absolute value of about 3° or more are present at a ratio that is equal to or greater than about 2% and equal to or less than about 5% of an entirety of the scandium-containing aluminum nitride film.

2. The acoustic wave device according to claim 1, wherein
   the scandium-containing aluminum nitride film includes a first principal surface and a second principal surface; and
   the electrode includes a first excitation electrode provided on the first principal surface of the scandium-containing aluminum nitride film and a second excitation electrode provided on the second principal surface thereof.

3. The acoustic wave device according to claim 2, further comprising:

a support substrate laminated on a second principal surface side of the scandium-containing aluminum nitride film; wherein
   a cavity portion is provided between the support substrate and the scandium-containing aluminum nitride film.

4. The acoustic wave device according to claim 3, wherein the support substrate is made of an insulating material or a semiconductor material.

5. The acoustic wave device according to claim 3, wherein the support substrate is a high-resistance silicon substrate.

6. The acoustic wave device according to claim 2, wherein a bulk acoustic wave is excited by the first excitation electrode and the second excitation electrode.

7. The acoustic wave device according to claim 2, wherein the first excitation electrode and the second excitation electrode are made of a metal or an alloy of metal.

8. The acoustic wave device according to claim 1, wherein the electrode is an interdigital transducer electrode.

9. The acoustic wave device according to claim 8, wherein the acoustic wave device is a surface acoustic wave device.

10. The acoustic wave device according to claim 8, wherein an acoustic wave propagating through the scandium-containing aluminum nitride film is a plate wave.

11. The acoustic wave device according to claim 1, wherein the first excitation electrode and the second excitation electrode overlap each other with the scandium-containing aluminum nitride film interposed therebetween.

12. The acoustic wave device according to claim 1, wherein the acoustic wave device is a bulk acoustic wave device.

13. The acoustic wave device according to claim 1, wherein the scandium-containing aluminum nitride film has a scandium concentration of about 6.8 atom %.

14. The acoustic wave device according to claim 1, wherein the scandium-containing aluminum nitride film has a scandium concentration of about 11.7 atom %.

* * * * *